United States Patent
Jung et al.

(10) Patent No.: US 8,514,637 B2
(45) Date of Patent: Aug. 20, 2013

(54) SYSTEMS AND METHODS OF CELL SELECTION IN THREE-DIMENSIONAL CROSS-POINT ARRAY MEMORY DEVICES

(75) Inventors: Chulmin Jung, Eden Prairie, MN (US); Jinyoung Kim, Edina, MN (US); Yong Lu, Edina, MN (US); Harry Liu, Maple Grove, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 519 days.

(21) Appl. No.: 12/502,111

(22) Filed: Jul. 13, 2009

(65) Prior Publication Data

US 2011/0007538 A1 Jan. 13, 2011

(51) Int. Cl.
*G11C 7/00* (2006.01)

(52) U.S. Cl.
USPC ............ 365/189.09; 365/185.23; 365/230.06

(58) Field of Classification Search
USPC ............ 365/185.23 X, 189.09 O, 230.06 X, 365/94

See application file for complete search history.

(56) References Cited

U.S. PATENT DOCUMENTS

| | | | |
|---|---|---|---|
| 4,879,551 A | 11/1989 | Georgiou et al. | |
| 5,008,214 A | 4/1991 | Redwind | |
| 5,110,753 A | 5/1992 | Gill et al. | |
| 5,467,308 A | 11/1995 | Chang et al. | |
| 5,481,125 A | 1/1996 | Harris | |
| 5,784,327 A | 7/1998 | Hazani | |
| 6,317,375 B1 | 11/2001 | Perner | |
| 6,385,075 B1 | 5/2002 | Taussig et al. | |
| 6,456,524 B1 | 9/2002 | Perner et al. | |
| 6,462,388 B1 | 10/2002 | Perner | |
| 6,498,747 B1 | 12/2002 | Gogl et al. | |
| 6,525,953 B1 | 2/2003 | Johnson | |
| 6,574,129 B1 | 6/2003 | Tran | |
| 6,597,598 B1 | 7/2003 | Tran et al. | |
| 6,618,295 B2 * | 9/2003 | Scheuerlein | 365/189.09 |
| 6,737,958 B1 | 5/2004 | Satyanarayana | |
| 6,753,561 B1 | 6/2004 | Rinerson et al. | |
| 6,767,816 B2 * | 7/2004 | Kleveland et al. | 438/600 |
| 6,831,854 B2 | 12/2004 | Rinerson et al. | |
| 6,859,410 B2 * | 2/2005 | Scheuerlein et al. | 365/230.06 |
| 6,870,751 B2 | 3/2005 | Van Brocklin et al. | |
| 6,891,748 B2 | 5/2005 | Tsuchida et al. | |
| 6,927,430 B2 | 8/2005 | Hsu | |
| 7,177,227 B2 | 2/2007 | Petti et al. | |
| 7,383,476 B2 | 6/2008 | Crowley et al. | |
| 7,911,856 B2 * | 3/2011 | Lee et al. | 365/189.14 |
| 2008/0205119 A1 | 8/2008 | Nagai et al. | |
| 2009/0097295 A1 | 4/2009 | Morimoto | |

OTHER PUBLICATIONS

Manners, D., "New memory technology to replace NAND," electronicsweekly.com, May 19, 2009, http://www.electronicsweekly.com/Articles/2009/05/19/46122/new-memory-technology-to-replace-nand.htm.

* cited by examiner

*Primary Examiner* — Vanthu Nguyen
(74) *Attorney, Agent, or Firm* — Hall Estill Attorneys at Law

(57) ABSTRACT

Three dimensional cross-point array memory devices and selecting cells within a three dimensional cross-point array memory. In a particular embodiment, three different voltages levels are applied to bit lines of the cross point array to allow for selection of a specific cell. Series of select devices may be implemented to provide a high voltage and a low voltage to specific bit lines, while a middle voltage may also be provided. In a particular embodiment, the select devices comprise Metal-Oxide-Semiconductor Field Effect Transistors (MOSFETs).

21 Claims, 4 Drawing Sheets

SYSTEMS AND METHODS OF CELL SELECTION IN THREE-DIMENSIONAL CROSS-POINT ARRAY MEMORY DEVICES

BACKGROUND

Several types of solid-state memory devices implement cross-point arrays of memory cells that are capable of two or more states that indicate a logic value stored by the memory cell. These cross-point arrays can be stacked vertically to help increase storage density. In some designs, this creates a need for additional stack lines below the memory stack or multiple additional lines for other issues, such as pitch matching. More efficient memory designs are needed.

DETAILED DESCRIPTION

In the following detailed description of the embodiments, reference is made to the accompanying drawings which form a part hereof, and in which are shown by way of illustration of specific embodiments. It is to be understood that other embodiments may be utilized and structural changes may be made without departing from the scope of the present disclosure.

Figure 1:
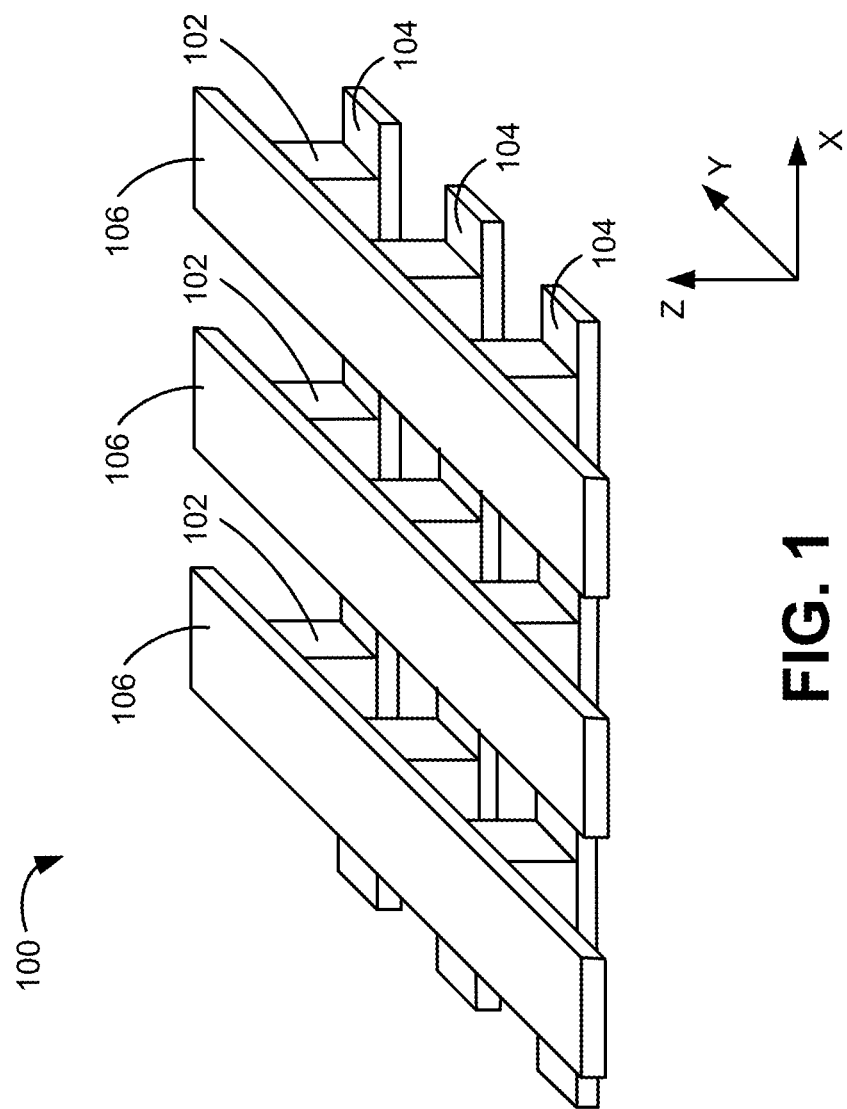
FIG. 1 is a perspective view of a particular embodiment of a system of cell selection in a cross-point array memory device.

Referring to FIG. 1, a cross-point array memory device is shown and generally designated 100. The cross-point array memory device 100 comprises memory cells 102. Only a relatively small number of memory cells 102 are shown to simplify the explanation of the cross-point array memory device 100. In practice, arrays of any size may be used and multiple layers of such arrays can be vertically stacked, such as in the z axis in the embodiment of FIG. 1, to create a three-dimensional cross-point array memory device, such as shown in FIG. 2.

Electrically connected to each memory cell 102 is a row conductor or line 104 and a column conductor or line 106 that are, in the embodiment of FIG. 1, arranged along the x and y axes, respectively, of the cross-point array memory device 100. Such an arrangement results in a memory cell 102 being located at each cross-point of a corresponding row and column line 104 and 106. Each memory cell 102 can comprise a storage element that can be modified, at least once, to store a logic value. The memory cells 102 can be written and read using a read/write circuit (not shown) that is configured to apply read and write potentials to selected memory cells 102. In a particular embodiment, the read/write circuit can be used to apply appropriate write potentials to the lines 104 and 106 associated with the selected memory cell 102 to change the resistance state of the cell during a write, and can apply appropriate read potentials to the lines 104 and 106 to determine the resistance state of the cell during a read. In some embodiments, memory cells 102 can comprise Resistive Sense Memory (RSM) cells.

Further, the cross-point array memory device 100 may include a control circuit (not shown) and line selection circuits (not shown) as described below. The control circuit may be hardware, software, logic circuits, or any combination thereof.

Figure 2:
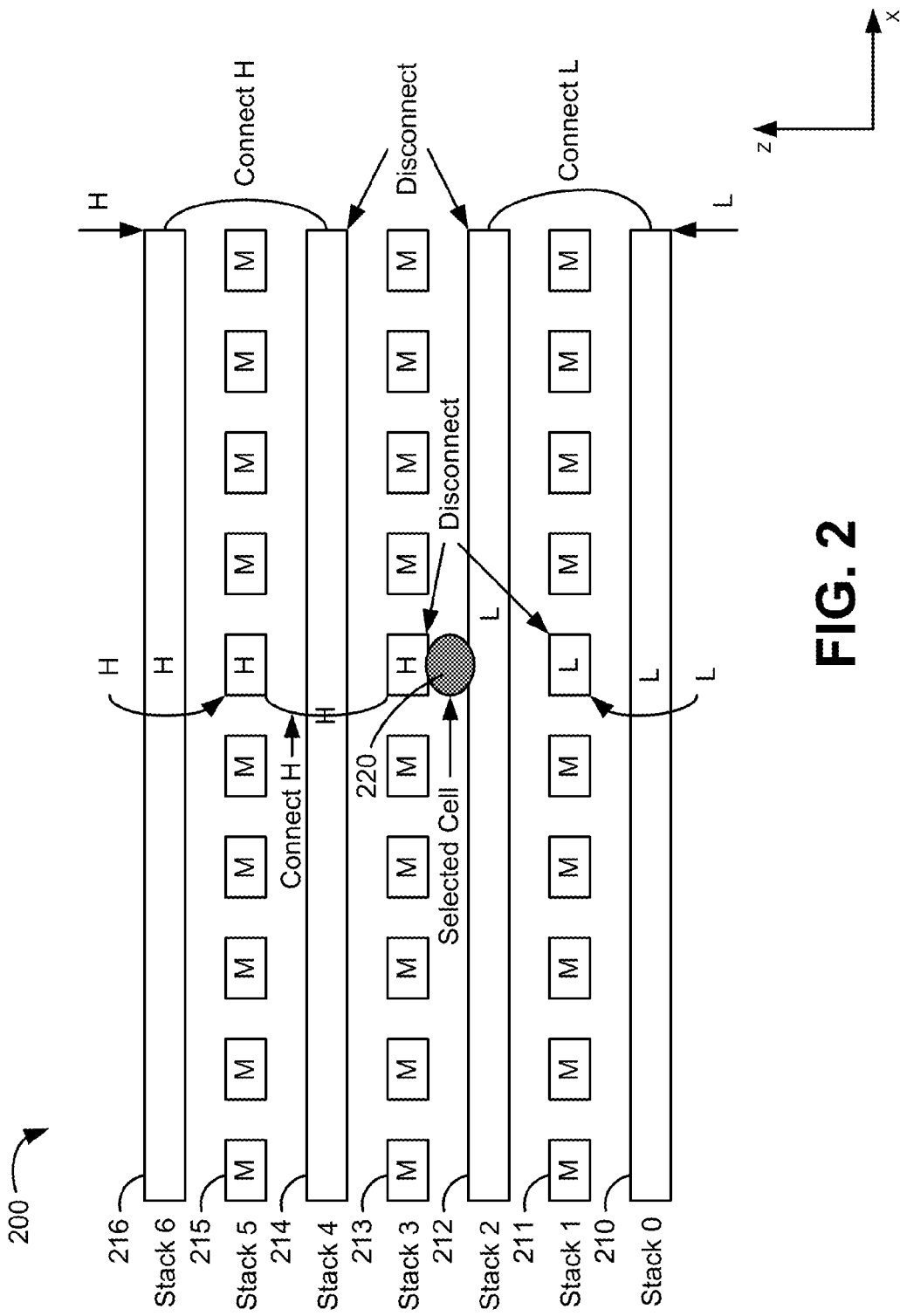
FIG. 2 is a cross section view of a system of cell selection in a three-dimensional cross-point array memory device.

A cross-section of a three-dimensional cross-point array memory device is shown in FIG. 2 and generally designated 200. The cross-point array memory device 200 comprises stacked levels of cross-point memory arrays. As shown, FIG. 2 includes stacks 0-6 labeled 210-216, respectively. Stacks 210, 212, 214, and 216 comprise lines that are generally perpendicular to lines within stacks 211, 213, and 215. To simplify the drawing, the memory cells have not been shown, but, as discussed with reference to FIG. 1, they occur at the locations where adjacent perpendicular lines intersect, when viewed along the x and y axes.

In a particular embodiment, selection of a cell may be performed using three voltages, a low voltage, a medium voltage, and a high voltage. The medium voltage may be an initial voltage of the memory array prior to any cell being selected and may be less than a critical voltage of a cell which contains a switch such as a diode. The high voltage may be a greater than the critical voltage of a cell. For example, the high voltage may be a positive power supply (Vcc), the medium voltage may be ½ Vcc, and the low voltage may be a nominal voltage. In a particular embodiment, the low voltage may be approximately zero volts (or another nominal voltage), the medium voltage may be approximately one volt, and the high voltage may be approximately two volts.

A specific memory cell may be selected by applying the high and low voltages to the relevant lines within the stacks. For example, as shown in FIG. 2, specific lines from stacks 6 and 4 may be connected to the high voltage (represented by "H" in FIG. 2), as well as specific lines from stacks 3 and 5. These connections may be made using selection circuits that comprise a series of select devices, such as transistors and Metal-Oxide-Semiconductor Field Effect Transistors (MOSFETs), as described below with respect to FIG. 3. Further, specific lines from stacks 0, 1, and 2 may be connected to the low voltage (represented by "L" in FIG. 2). With the ability to apply high, medium, or low voltage to specific lines, a specific memory cell can be selected when a high voltage line intersects a low voltage line, as represented by selected cell 220. Once the selected cell 220 is selected, the cell may be written to or read from.

Figure 3:
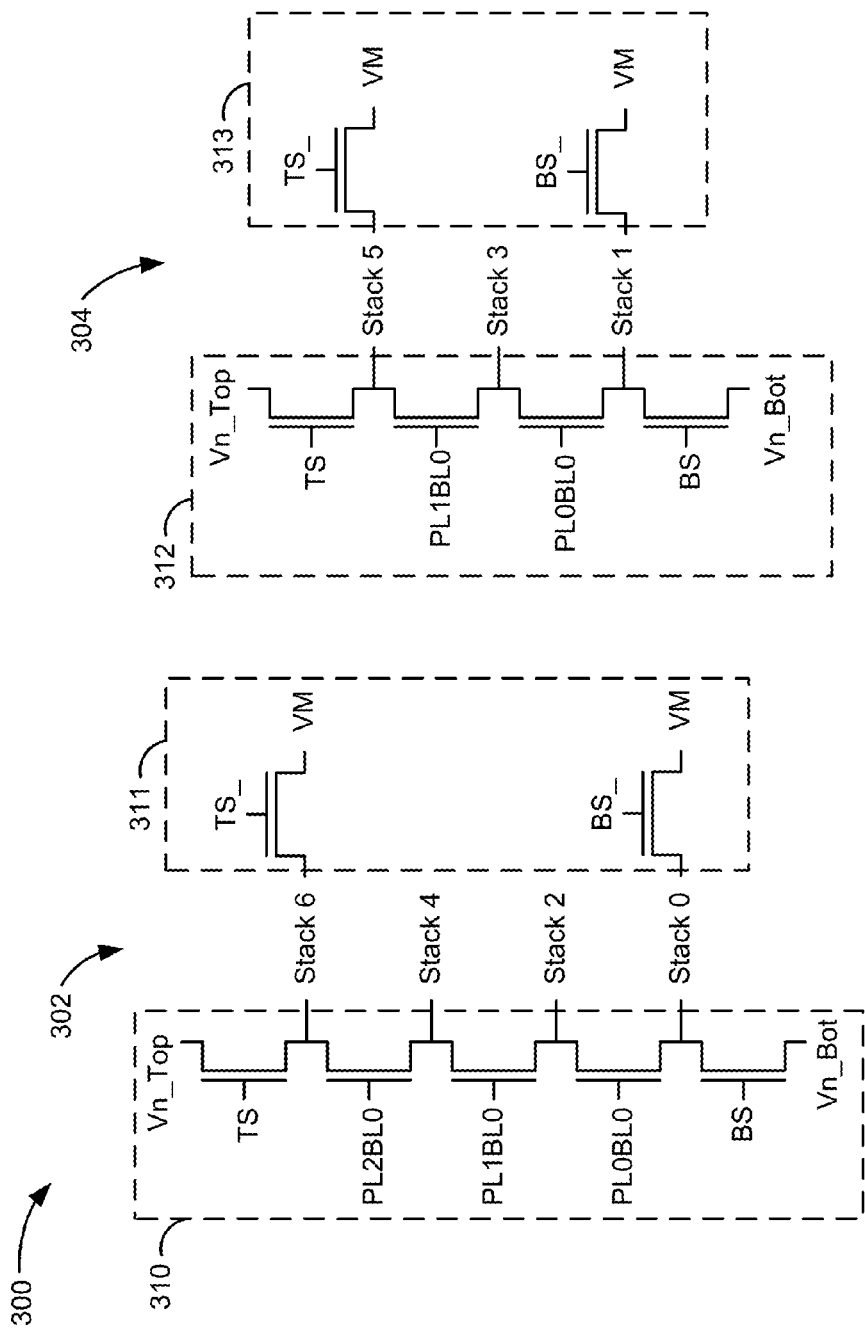
FIG. 3 is a circuit diagram of a particular embodiment of a system of cell selection in cross-point array memory devices.

Referring to FIG. 3, a circuit diagram of a particular embodiment of a system of cell selection in cross-point array memory devices is shown and generally designated 300. The system of cell selection 300 may include a first line selection circuit 302 and second line selection circuit 304 that can operate to provide high, medium, or low power to selected lines. While just one example is shown, many more line selection circuits may be typically needed. In one embodiment, a number of line selection circuits equals two times the number of lines within a single stack.

The first line selection circuit 302 may operate to provide power to lines arranged parallel to a first axis, such as the x axis shown in FIG. 1 or FIG. 2. Further, the first line selection circuit 302 may provide power to specific lines, one from each respective stack, that are in the same vertical plane, such as a plane of the z axis shown in FIG. 1 and FIG. 2. The second line selection circuit 304 may operate to provide power to lines arranged perpendicular to the first axis, such as in the direction of the y axis shown in FIG. 1 and FIG. 2. The second line selection circuit 304 may provide power to specific lines, one from each respective stack, that are in the same vertical plane.

For example, with reference to FIG. 2, the first selection circuit 302 may provide power to specific lines of stacks 0, 2, 4, and 6 that are in the same vertical plane, while the second selection circuit 304 may provide power to specific lines of stacks 1, 3, and 5 that are in the same vertical plane. In a particular embodiment, the first line selection circuit 302 can provide power to a same numbered bit line of each stack arranged in a first direction and the second line selection circuit 304 can provide power to a same numbered bit line of each stack arranged in a second direction that is substantially perpendicular to the first direction.

As shown in the example of FIG. 3, the first line selection circuit 302 and the second line selection circuit 304 may provide power to bit line 0 for each stack. The first line selection circuit 302 comprises a first series of select devices 310 and a second series of select devices 312 to provide the high voltage (Vn_Top) or the low voltage (Vn_Bot) to selected stacks. In some embodiments, select devices 310 and select devices 312 may comprise MOSFETs. A stack may be selected via operation of the select devices in series.

For example, to select the specific cell as shown in the example of FIG. 2, the system will apply a high voltage to a specific line of stacks 3, 4, 5 and 6 and a low voltage to the specific line of stacks 0, 1, and 2. To apply the voltages, a voltage above the threshold voltage for the select devices will be applied at the gates of the respective select devices.

For the high voltage, the threshold voltage will be applied at TS and PL2BL0 of the first series of select devices 310 for stacks 6 and 4, and at TS and PL1BL0 of the second series of select devices 312 for stacks 5 and 3. This will connect bit line 0 of stack 4 and bit line 0 of stack 6 to the high voltage, as shown in FIG. 2. This will also connect bit line 0 of stack 3 and bit line 0 of stack 5 to the high voltage, as shown in FIG. 2.

For the low voltage, the threshold voltage will be applied at BS and PL0BL0 of the first series of select devices 310 for stacks 0 and 2, and at BS of the second series of select devices 312 for stack 1. This will connect bit line 0 of stack 0 and bit line 0 of stack 2 to the low voltage, as shown in FIG. 2. This will also connect bit line 0 of stack 1 to the low voltage, as shown in FIG. 2.

By not applying a voltage greater than the threshold voltage at the gate labeled PL1BL0 of the first series of select devices 310, we can cause the disconnect between stack 2 and stack 4 shown in FIG. 2. Further, by not applying a voltage greater than the threshold voltage at the gate labeled PL0BL0 of the second series of select devices 312, we can cause the disconnect between stack 1 and stack 3 shown in FIG. 2.

The system can apply the middle voltage to bit lines (represented by "M" in FIG. 2) that are not needed to select a cell, such as in circuits 311 and 313. Although not all of the select devices are shown in FIG. 3, Circuits 311 and 313 may include a select device for each bit line of each stack. Each of the select devices of circuits 311 and 313 may have its drain coupled to the middle voltage and its source coupled to a respective bit line; thus, when a critical voltage is applied at the gate (such as TS_ or BS_), the middle voltage is applied to the respective bit line.

Thus, the system is able to apply three different voltage levels to facilitate selecting a cell. Specifically, the selected cell 220 occurs where a high voltage bit line intersects a low voltage bit line. Application and control of the voltages by the circuits 310, 311, 312, and 313 may be controlled by hardware, software, or a combination of both, such as a controller, an integrated circuit, a discrete circuit, or hardware logic. The selection system and circuit(s) allow for a select device based selection of a particular cell. One of the benefits of this type of selection system and circuit(s) is a simplified layout as shown and discussed in FIG. 4.

Figure 4:
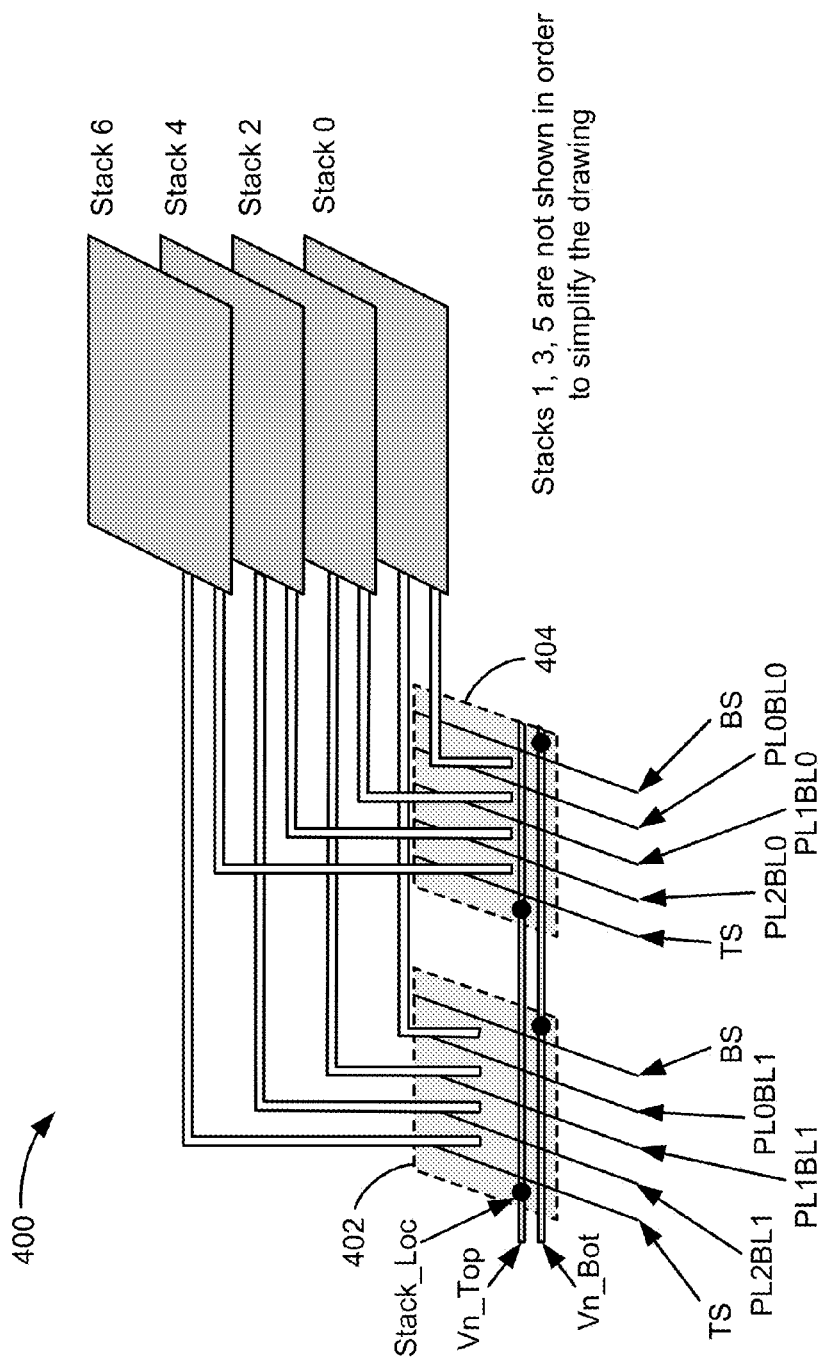
FIG. 4 is a layout diagram of another particular embodiment of a system of cell selection in cross-point array memory devices.

Referring to FIG. 4, a layout diagram of a particular embodiment of a system of cell selection in a cross-point array memory device is shown and generally designated 400. The system 400 provides a particular example of the connections that can be made to implement the cross-point array selection systems of FIG. 2 and FIG. 3. Only a relatively small number of components and connections to bit lines are shown to simplify the explanation of the system 400. While FIG. 4 shows examples of the connections that can be made, one skilled in the art will recognize that FIG. 4 is not a comprehensive schematic and that many more similar connections would need to be made to build a cell selection system as discussed herein.

The system 400 can include select device junction area 402 and 404 that are coupled to respective bit lines of stacks 0, 2, 4, and 6. Each select device junction area can include a connection to a bit line from each of the stacks. Preferably, each select device junction area contains a connection to a bit line from each respective stack that are in the same vertical plane, such as a plane of the z axis shown in FIG. 1 and FIG. 2. The select device junction area 404 can implement the first series of select devices 310 shown in FIG. 3.

In a particular embodiment, the select device junction area 402 and 404 can be implemented on a single substrate layer of a chip. The layout of the select devices on a single layer, during testing, has shown to have a substrate area reduction of about 70% compared to systems that use different selection mechanisms, such as multi-layer CMOS technology.

Even though numerous characteristics and advantages of various embodiments have been set forth in the foregoing description, together with details of the structure and function of various embodiments, this disclosure is illustrative only, and changes may be made in detail, especially in matters of structure and arrangement of parts within the principles discussed herein. The illustrations are not intended to serve as a complete description of all of the elements and features of apparatus and systems that utilize the structures or methods described herein. Many other embodiments may be apparent to those of skill in the art upon reviewing the disclosure. For example, the particular elements may vary depending on the particular application for the data storage system while maintaining substantially the same functionality without departing from the scope and spirit of the present disclosure.

What is claimed is:

1. A device comprising:
a three-dimensional cross point array memory comprising multiple stacks of memory cells;
a first selection circuit comprising multiple first select devices in series and configured to selectively provide first and second voltages to respective first bit lines of a first subset of the multiple stacks, wherein the first subset comprises at least two stacks of the multiple stacks of memory cells having bit lines substantially parallel to one another, and wherein the first voltage is provided to a first stack of the at least two stacks and the second voltage is provided to a different second stack of the at least two stacks to select a particular memory cell;
a second selection circuit comprising multiple second select devices in series and configured to selectively provide the first and second voltages to respective second bit lines of a second subset of the multiple stacks, wherein the second subset comprises at least one stack of the multiple stacks of memory cells having bit lines substantially perpendicular to the bit lines of the first subset; and a third selection circuit comprising at least one third select device configured to selectively provide a third voltage to a bit line of a stack in the multiple stacks, wherein the first voltage is greater than the second and third voltages and the third voltage is between the first and second voltages.

2. The device of claim 1 further comprising:

a control circuit coupled to the first, second, and third selection circuits and configured to selectively enable the first, second, and third voltages to be applied to selected bit lines to select the particular memory cell located immediately adjacent the first and second subsets of the multiple stacks, the second subset disposed between the first subset.

3. The device of claim 2 wherein the control circuit is configured to enable the third voltage to be applied to the selected bit lines when neither the first nor second voltage is applied to the selected bit lines.

4. The device of claim 2 wherein the particular memory cell may be written and read when it is selected.

5. The device of claim 1 further comprising a number X of first selection circuits, a number Y of second selection circuits, and a number Z of third selection circuits, wherein X and Y both equal the number of bit lines in a single stack of the multiple stacks, and wherein Z equals a total number of bit lines in the multiple stacks.

6. The device of claim 1 wherein the first voltage is of sufficient magnitude to place a switching device of the particular memory cell in a conductive state, and the second and third voltages are of insufficient magnitude to place said switching device in a conductive state.

7. The device of claim 1 wherein the first selection circuit, second selection circuit, and third selection circuit are located on a single substrate layer of an integrated circuit.

8. The device of claim 7 further comprising:

the first selection circuit comprising a number N of Metal-Oxide-Semiconductor Field Effect Transistors (MOSFETs) that equals one more than the number of stacks in the first subset; and the second selection circuit comprising a number M of MOSFETs that equals one more than the number of stacks in the second subset.

9. The device of claim 1 wherein:

the first bit lines comprise a single bit line from each stack of the first subset and all of the first bit lines are substantially within a first plane that intersects the particular memory cell and are substantially parallel to one another;

the second bit lines comprise a single bit line from each stack of the second subset and all of the second bit lines are substantially within a second plane that intersects the particular memory cell and are substantially parallel to one another; and wherein the first plane and the second plane are substantially perpendicular to each other.

10. The device of claim 1, in which the third voltage is applied by the third selection circuit to a subset of the bit lines in each stack of the multiple stacks in the cross-point array during said application of the first and second voltages by the first and second selection circuits.

11. The device of claim 1, in which all of the stacks disposed above the particular memory cell in the array form an upper subset of stacks, all of the stacks disposed below the particular cell in the array form a lower subset of stacks, the first voltage is applied to all of the bit lines in the upper subset of stacks that intersect a vertical line passing through the particular memory cell, the second voltage is applied to all of the bit lines in the lower subset of stacks that intersect said vertical line, and the third voltage is applied to all remaining bit lines in the upper and lower subsets of stacks.

12. An apparatus comprising:

a three-dimensional cross point array memory comprising multiple stacks of spaced apart bit lines, wherein the bit lines in even numbered stacks extend in a first direction, the bit lines in odd numbered stacks extend in a second direction orthogonal to the first direction, and a number of memory cells are arranged between each adjacent pair of the stacks of bit lines; and a selection circuit adapted to perform an access operation upon a selected memory cell in the array by applying a first voltage to all of the bit lines above the selected memory cell that intersect a vertical line passing therethrough, a second voltage to all of the bit lines below the selected memory cell that intersect said vertical line, and a third voltage to at least one bit line in each stack that does not intersect said vertical line.

13. The apparatus of claim 12, in which the third voltage is applied to all remaining bit lines in the array that do not intersect the vertical line.

14. The apparatus of claim 12, in which the selection circuit comprises:

a first selection circuit comprising multiple first select devices in series and configured to selectively provide the first and second voltages to respective bit lines extending in the first direction;

a second selection circuit comprising multiple second select devices in series and configured to selectively provide the first and second voltages to respective bit lines extending in the second direction; and a third selection circuit comprising multiple third select devices in series and configured to selectively provide the third voltage to respective bit lines extending in the first direction and to bit lines extending in the second direction.

15. The apparatus of claim 12, wherein the first voltage is greater than the second and third voltages and the third voltage is between the first and second voltages.

16. The apparatus of claim 14 wherein the first voltage is of sufficient magnitude to place a switching device of the selected memory cell in a conductive state, and the second and third voltages are of insufficient magnitude to place said switching device in a conductive state.

17. An apparatus comprising:

a memory characterized as a three-dimensional cross-point array of memory cells, the array comprising multiple stacks of spaced apart bit lines, wherein the bit lines in even numbered stacks extend in a first direction, the bit lines in odd numbered stacks extend in a second direction orthogonal to the first direction, and the memory cells are arranged between each adjacent pair of the stacks of bit lines; and a selection circuit adapted to perform a data access operation upon a selected memory cell within the array which is disposed within a first vertical plane that intersects a first subset of the bit lines extending in the first direction and within a second vertical plane that intersects a second subset of the bit lines extending in the second direction, wherein the selection circuit operates to apply a first voltage to the bit lines in the first and second vertical planes above the selected memory cell, a second voltage to the bit lines in the first and second vertical planes below the selected memory cell, and a third voltage to remaining bit lines in the array.

18. The apparatus of claim 17, in which the selection circuit comprises:
a first selection circuit comprising multiple first select devices in series and configured to selectively provide the first and second voltages to the bit lines in the first vertical plane;
a second selection circuit comprising multiple second select devices in series and configured to selectively provide the first and second voltages to the bit lines in the second vertical plane; and
a third selection circuit comprising multiple third select devices in series and configured to selectively provide the third voltage to the bit lines extending in the first direction and the second direction that do not intersect the first or second vertical planes.

19. The apparatus of claim 17, wherein the first voltage is of sufficient magnitude to place a switching device of the selected memory cell in a conductive state, the second and third voltages are of insufficient magnitude to place said switching device in a conductive state, and the third voltage is greater than the second voltage.

20. An apparatus comprising:
a three-dimensional cross point array memory comprising multiple stacks of spaced apart bit lines, wherein the bit lines in even numbered stacks extend in a first direction, the bit lines in odd numbered stacks extend in a second direction orthogonal to the first direction, memory cells are arranged between each adjacent pair of the stacks of bit lines, all of the stacks disposed above a particular memory cell in the array form an upper subset of stacks, and all of the stacks disposed below the particular cell in the array form a lower subset of stacks;
a first selection circuit comprising multiple first select devices in series and configured to selectively provide first and second voltages to respective first bit lines of the array;
a second selection circuit comprising multiple second select devices in series and configured to selectively provide the first and second voltages to respective second bit lines of the array, wherein the first and second selection circuits operate to apply the first voltage to all of the bit lines in the upper subset of stacks that intersect a vertical line passing through the particular memory cell and to apply the second voltage to all of the bit lines in the lower subset of stacks that intersect said vertical line; and
a third selection circuit comprising at least one third select device configured to selectively provide a third voltage to all remaining bit lines in the upper and lower subsets of stacks.

21. The apparatus of claim 20, wherein the first voltage is greater than the second and third voltages and the third voltage is between the first and second voltages.

* * * * *